(12) United States Patent
Riegel et al.

(10) Patent No.: US 10,490,767 B2
(45) Date of Patent: Nov. 26, 2019

(54) ORGANIC LIGHT-EMITTING DIODE

(71) Applicant: OSRAM OLED GmbH, Regensburg (DE)

(72) Inventors: Nina Riegel, Tegernheim (DE); Daniel Riedel, München (DE); Thomas Wehlus, Lappersdorf (DE); Arne Fleißner, Regensburg (DE); Armin Heinrichsdobler, Bad Abbach (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/072,563

(22) PCT Filed: Dec. 21, 2016

(86) PCT No.: PCT/EP2016/082170
§ 371 (c)(1),
(2) Date: Jul. 25, 2018

(87) PCT Pub. No.: WO2017/129332
PCT Pub. Date: Aug. 3, 2017

(65) Prior Publication Data
US 2019/0036062 A1    Jan. 31, 2019

(30) Foreign Application Priority Data

Jan. 28, 2016   (DE) ................... 10 2016 101 517

(51) Int. Cl.
*H01L 51/52*     (2006.01)
*H01L 27/32*     (2006.01)

(52) U.S. Cl.
CPC ...... *H01L 51/5203* (2013.01); *H01L 27/3241* (2013.01); *H01L 51/5237* (2013.01); *H01L 51/5284* (2013.01)

(58) Field of Classification Search
CPC ............. H01L 51/5203; H01L 51/5237; H01L 27/3241; H01L 51/5284; H01L 27/14623; H01L 27/14818; H01L 29/78633
See application file for complete search history.

(56) References Cited

U.S. PATENT DOCUMENTS

2011/0242467 A1* 10/2011 Kim ................. G02F 1/133308
                                                        349/113
2014/0071537 A1*  3/2014 Park ...................... G02B 7/00
                                                        359/614

(Continued)

FOREIGN PATENT DOCUMENTS

DE         103 92 604 T5     5/2005
DE      10 2006 040 788 B4   2/2013

(Continued)

*Primary Examiner* — Earl N Taylor
(74) *Attorney, Agent, or Firm* — DLA Piper LLP (US)

(57) ABSTRACT

An organic light-emitting diode includes a carrier; at least two electrodes; an organic layer sequence having at least one active zone that generates light; and light-opaque visual protection layers that have no influence on an emission characteristic of the organic layer sequence and the organic light-emitting diode, one of which is located directly on the carrier, the organic layer sequence is located between the two electrodes and one of the electrodes is attached directly to the carrier, the visual protection layer, viewed in a plan view, completely surrounds the organic layer sequence, at least one of the electrodes is provided with a structuring in a region adjacent to the organic layer sequence in a plan view, in a plan view, the structuring is located completely beside the organic layer sequence, and the structuring is hidden by the visual protection layer for a viewer from outside the organic light-emitting diode.

14 Claims, 3 Drawing Sheets

(56) References Cited

U.S. PATENT DOCUMENTS

| | | | | |
|---|---|---|---|---|
| 2014/0078585 A1* | 3/2014 | Kim | .......................... | G09F 9/33 |
| | | | | 359/513 |
| 2015/0155347 A1* | 6/2015 | Baek | ................... | H01L 27/3272 |
| | | | | 257/40 |
| 2015/0179586 A1* | 6/2015 | Youk | ................... | H01L 51/5284 |
| | | | | 428/195.1 |
| 2019/0036062 A1* | 1/2019 | Riegel | ................. | H01L 27/3241 |

FOREIGN PATENT DOCUMENTS

| | | |
|---|---|---|
| EP | 3 012 820 A1 | 4/2016 |
| WO | 2014/203711 A1 | 12/2014 |

\* cited by examiner

A)

B)

A)

B)

ORGANIC LIGHT-EMITTING DIODE

TECHNICAL FIELD

This disclosure relates to an organic light-emitting diode.

BACKGROUND

There is a need to provide an organic light-emitting diode having a homogeneous external appearance.

SUMMARY

We provide an organic light-emitting diode including a carrier; at least two electrodes; an organic layer sequence having at least one active zone that generates light; and light-opaque visual protection layers that have no influence on an emission characteristic of the organic layer sequence and the organic light-emitting diode, wherein one of the visual protection layers is located directly on the carrier, the organic layer sequence is located between the two electrodes and one of the electrodes is attached directly to the carrier, the visual protection layer, viewed in a plan view, completely surrounds the organic layer sequence, at least one of the electrodes is provided with a structuring in a region adjacent to the organic layer sequence in a plan view, in a plan view, the structuring is located completely beside the organic layer sequence, and the structuring is hidden by the visual protection layer for a viewer from outside the organic light-emitting diode.

We also provide an organic light-emitting diode including a carrier; at least two electrodes; an organic layer sequence having at least one active zone that generates light; and at least one light-opaque visual protection layer, wherein the organic layer sequence is located between the two electrodes and at least one of the electrodes is attached to the carrier, the visual protection layer, viewed in a plan view, completely surrounds the organic layer sequence, at least one of the electrodes is provided with a structuring in a region adjacent to the organic layer sequence in a plan view, and the structuring is hidden by the visual protection layer for a viewer from outside the organic light-emitting diode.

Figure 1:
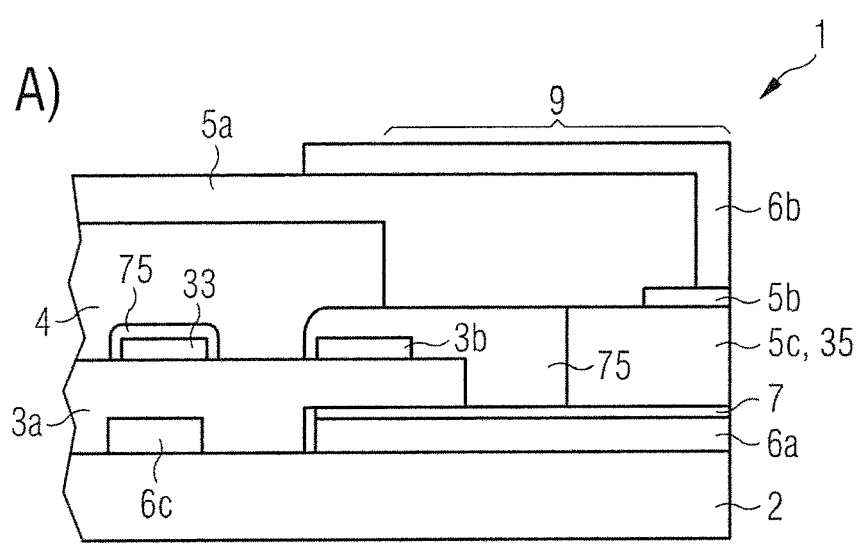
FIGS. 1A-1B and 3 show schematic representations of examples of organic light-emitting diodes.
Figure 1:
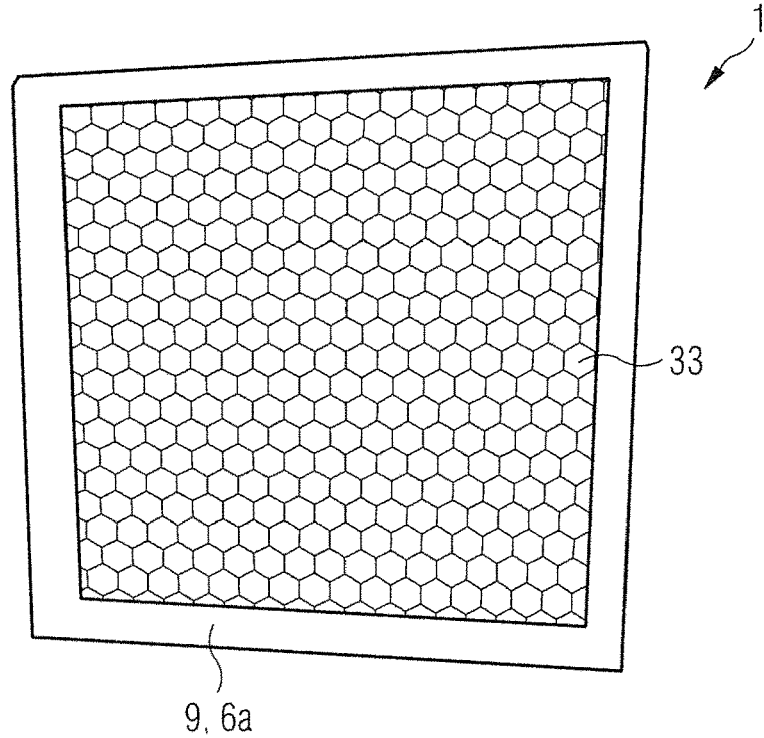

LIST OF REFERENCE SIGNS 1 organic light-emitting diode
2 carrier
3 first electrode
33 metallic central contact strips
35 TCO strip
4 organic layer sequence
5 second electrode
6 visual protection layer
7 insulation layer
75 electrical insulation
8 adhesive layer
9 structuring

DETAILED DESCRIPTION

Our organic light-emitting diode comprises a carrier. The carrier can be the component that mechanically carries and stabilizes the organic light-emitting diode. The carrier can be mechanically rigid or also mechanically flexible. It is possible for the carrier to be light-transmissive or also opaque.

The organic light-emitting diode may comprise two or more than two electrodes. The organic light-emitting diode can be electrically contacted externally and electrically interconnected via the two electrodes. The electrodes can be made in one piece. Preferably, however, the electrodes each contain a plurality of components, also made of different materials.

The organic light-emitting diode may have an organic layer sequence. The organic layer sequence comprises at least one active zone in which electromagnetic radiation is generated during operation. The electromagnetic radiation is preferably visible light, in particular colored light such as blue, green and/or red light or mixed-colored light such as white light. In addition to the at least one active zone, the organic layer sequence can comprise further layers such as charge carrier generation layers, charge carrier transport layers and/or charge carrier injection layers.

The organic light-emitting diode may comprise one or more opaque visual protection layers. The at least one visual protection layer conceals parts of an inner life of the organic light-emitting diode for a viewer and thus achieves a more homogeneous, more uniform overall optical impression for a viewer.

The organic layer sequence may be located partially, for the most part or completely between the electrodes. A current impression into the organic layer sequence preferably takes place exclusively via the electrodes. In particular, the electrodes are at least partially planar and cover the organic layer sequence completely or for the most part. 'For the most part' can mean at least 80% or 90% or 95%.

One of the electrodes may be located directly or indirectly on the carrier. For example, one of the electrodes comprises a layer made of a transparent conductive oxide, TCO for short such as ITO, and is arranged directly on the carrier, which is formed, for example, by a glass film, a plastic film or a glass plate. In other words, the carrier and at least one of the electrodes can touch one another in places or over the whole area.

The visual protection layer, viewed in a plan view, may surround the organic layer sequence all around or essentially all around. 'Essentially' can mean that the visual protection layer surrounds the organic layer sequence, relative to a length of a contour line of the organic layer sequence, on a length of at least 80% or 90% or 95%. If the organic light-emitting diode is a flexible organic light-emitting diode, then the term 'plan view' preferably relates to a relaxed, unbent state of the organic light-emitting diode.

At least one of the electrodes may be provided with a structuring in a region next to the organic layer sequence, seen in a plan view. By such a structuring, a uniform current density across the organic layer sequence and/or a segmentation of the organic light-emitting diode into a plurality of regions that can be electrically controlled independently of one another can be achieved.

Structuring of at least one electrode may be hidden by the visual protection layer for a viewer from outside the organic light-emitting diode. Thus, for example, conductor tracks, constrictions or comb structures of the electrodes, which can interfere with an overall impression of the organic light-emitting diode, are not perceptible to a viewer from outside the organic light-emitting diode during normal operation and use.

The organic light-emitting diode may comprise a carrier and two electrodes. Between the two electrodes there is an organic layer sequence having at least one active zone that generates light. The organic light-emitting diode further comprises one or more opaque visual protection layers. Viewed in a plan view, the visual protection layer surrounds the organic layer sequence all around. At least one of the electrodes is provided with a structuring in a region next to the organic layer sequence when viewed in a plan view. This structuring is concealed by the visual protection layer for a viewer from outside the organic light-emitting diode.

In particular in the automotive sector, in organic light-emitting diodes a segmentation of a luminous surface is desired. At the same time, high-quality aesthetics are to be achieved and the luminous surface should have independently controllable, preferably homogeneously luminous segments. It is also often desirable for illumination scenarios to be able to be implemented with the organic light-emitting diode, for example, a greeting mode. To ensure homogeneous emission of the organic light-emitting diode over a luminous surface and also a segmentation of the luminous surface, the electrodes of the organic light-emitting diode are usually structured at an edge, in particular next to an organic layer sequence, for example, with conductor tracks or comb-like structures.

However, these structures of the electrodes can adversely affect the overall optical impression of the organic light-emitting diode. With the visual protection layer described here, such structures are to be concealed and high-quality aesthetics of the light-emitting diode can be achieved. However, the visual protection layer preferably does not or not significantly adversely affect the electrical and optical properties of the organic light-emitting diode. In addition, it is possible by such a visual protection layer to prevent or hinder reproduction of the organic light-emitting diode with regard to the structuring of the electrodes. In other words, with such a visual protection layer a reconstruction of the structure, also referred to as reverse engineering, can be prevented and a type of copy protection can be achieved.

The visual protection layer may be electrically conductive or may have at least one electrically conductive partial layer. For example, the visual protection layer then comprises a metal or a metal alloy or consists thereof.

The visual protection layer may be electrically isolated from the two electrodes and the organic layer sequence. This electrical separation is effected, for example, by an insulation layer that can be located between the visual protection layer and the electrodes and/or the organic layer sequence. The insulation layer is preferably designed to be translucent. The insulation layer may consist of an adhesive, a resin or an oxide layer such as silicon oxide or aluminum oxide.

The visual protection layer may be located in places or over the whole area between a first electrode and the carrier. The first electrode is the electrode located closer to the carrier on average than a second electrode. In particular, the first electrode lies between the organic layer sequence and the carrier, and the second electrode is for the most part located on a side of the organic layer sequence facing away from the carrier.

The visual protection layer may only be partially covered by the first electrode, in a plan view from the side with the organic layer sequence onto the carrier. In other words, the visual protection layer, when viewed in a perpendicular projection onto the carrier, is free of the first electrode and optionally also of the second electrode.

The visual protection layer may terminate flush in regions or all around with a region of the organic layer sequence which is supplied with current by the electrodes, in the lateral direction, that is to say in a direction perpendicular to a main emission direction of the organic layer sequence and/or in the direction parallel to a main side of the carrier. In other words, the visual protection layer then terminates flush with a region of the organic layer sequence in which light is generated. In this case, 'flush' can mean with a tolerance of at most 2 mm or 1 mm or 0.5 mm or 0.2 mm. The tolerance is alternatively or additionally preferably at most 2% or 1% or 0.5% or 0.2% of a mean diameter of the organic light-emitting diode. The organic layer sequence has a negligible electrical transverse conductivity. In other words, a region of the organic layer supplied with current does not or not significantly deviate from a region in which radiation is generated in the organic layer sequence.

The visual protection layer may terminate in a lateral direction in regions or all around flush with a strip made of a transparent conductive oxide. In this case, the strip is preferably attached to the carrier, wherein the visual protection layer can be located between the carrier and the strip.

The strip of the transparent conductive oxide may surround the organic layer sequence, viewed in plan view, completely or for the most part. Furthermore, the strip is preferably completely or for the most part located next to the organic layer sequence, seen in plan view. Once again, in a plan view, an intermediate space can be present between the organic layer sequence and this strip so that the strip and the organic layer sequence do not touch each other. It is possible for the strip to be formed from the same material as a region of the first electrode that contacts the organic layer sequence and is configured to impress current into the organic layer sequence.

The strip of the transparent conductive oxide may be applied directly to the carrier. In this case, the carrier is preferably translucent such as a glass or a plastic or a ceramic. In this case, the strip can be located between the carrier and the visual protection layer.

The visual protection layer may be fixedly connected to one or both electrodes with a connecting layer that can be an adhesive layer. In this case, it is possible for the adhesive layer to adhere more strongly to one of the electrodes or the electrodes than the electrode does to a material lying opposite the adhesive layer. In other words, the adhesive layer and thus the visual protection layer are irreversibly fastened to the associated electrode. This means, for example, that the visual protection layer cannot be removed without destroying one or both electrodes. In particular, the adhesive layer fills an intermediate space between the visual protection layer and the associated electrode without gaps, in a form-fit manner and/or completely.

The visual protection layer may comprise an in particular organic matrix material and at least one foreign substance dissolved therein or consists of the matrix material together with the at least one foreign substance. In this case, the matrix material is, for example, a light-transmissive material such as an epoxide, a silicone or a polycarbonate. The matrix material is preferably electrically insulating.

The one or more foreign substances may be opaque. In this case, the foreign substances can be electrically insulating or also electrically conductive. In particular, the foreign substance(s) is or are selected from the following group: scattering particles, phosphor, dye, heat-conducting body. Scattering particles serve to deflect and scatter the incident light in different directions. In phosphors, an incident wavelength is converted into radiation of another, preferably greater wavelength. Dyes change a spectral signature by absorption of radiation without producing additional wavelengths. By heat conducting bodies, for example, by metallic threads or carbon nanotubes, a thermal conductivity of the visual protection layer, relative to the matrix material, is increased.

The visual protection layer may comprise or consist of one, two or more than two metals. In particular, it is possible for a metallic visual protection layer to act as a mirror for radiation impinging from the outside onto the organic light-emitting diode.

The visual protection layer may comprise at least one metal also present in one or both electrodes. Furthermore, the visual protection layer preferably contains at least one further metal that does not occur in the electrodes.

The visual protection layer and one or both electrodes may comprise(s) one or more of the following metals: silver, aluminum, chromium, magnesium.

The visual protection layer may comprise one or more of the following metals, wherein these metals preferably do not occur in at least one of the electrodes or in both electrodes: gold, bismuth, chromium, copper, molybdenum, tin, platinum. A proportion by weight of each individual of these metals or of all of these metals taken together on the visual protection layer is in particular at least 1% or 2% or 5% and/or at most 30% or 20% or 10%. By the addition of such metals to the visual protection layer, an analysis of a material composition of the electrodes, for example, by energy-dispersive X-ray spectroscopy or EDX for short, is prevented or hindered.

The first electrode located closer to the carrier may comprise central contact strips. The central contact strips are preferably produced from one or more metals. A uniform, areal current distribution across the first electrode can be achieved by the central contact strips. This applies in particular if the first electrode is based on an electrically comparatively poorly conductive material such as a transparent conductive oxide as the structure to impress current into the organic layer sequence.

The visual protection layer may be additionally located between the carrier and the central contact strip. As a result, it is possible for an observer that, from outside the organic light-emitting diode, the central contact strips remain hidden and cannot be seen. The visual protection layer can run congruently to the central contact strips or also can have a shape deviating from the central contact strip, viewed in a plan view.

The organic light-emitting diode may comprise a plurality of light-emitting, electrically individually controllable segments. The segments are preferably located in a common plane and/or have a common, constant distance from the carrier. The organic layer sequence can extend over all segments in an unchanged composition and thickness so that a subdivision into the segments is achieved only by shaping of the electrodes. A size of a light-emitting surface of the individual segments is preferably each at least 1 $mm^2$ or 1 $cm^2$ or 10 $cm^2$. In other words, segments are then comparatively large.

At least the second electrode located on a side of the organic layer sequence facing away from the carrier may be structured into a plurality of individually controllable sections. The sections preferably have the same material compositions and/or an identical layer structure. It is possible for the organic light-emitting diode to additionally comprise a control unit, for example, an integrated circuit to achieve addressing and controlling of the individual sections.

The first electrode and/or the second electrode may have a plurality of partial regions made of different materials. For example, the electrodes each comprise areally applied first partial regions made of contact materials to impress current into the organic layer sequence such as ITO or Ag. Furthermore, second partial regions, for example, from metallizations can be present to electrically contact the current-impressing layer externally. Such second partial regions can be electrically contacted, for example, by soldering, electrically conductive adhesive bonding or clamping.

At least one of the partial regions of the first electrode and/or of the second electrode may be completely covered by the visual protection layer, seen in plan view. This applies specifically to the second partial regions. In particular, a comb structure of the second partial regions of the second electrode is formed and completely hidden by the visual protection layer, wherein the comb structure can homogenize a current impression into the organic layer sequence.

The visual protection layer may cover one or both of the electrodes on both sides. In other words, protection layers can be located on both sides of one of the electrodes or both electrodes. This applies in particular in organic light-emitting diodes configured to emit light on both sides and/or are light-transmissive in places.

The visual protection layer may be provided with a roughening and/or a structuring. Such a roughening or structuring serves in particular for light scattering. In other words, the visual protection layer can appear dull to an observer. Furthermore, it is possible for a roughening or structuring of the visual protection layer to be located on a side facing the electrodes. In this case, improved adhesion to the electrodes can be achieved by a roughening. As a result, it can be made difficult to detach the visual protection layer from the electrodes or from other components of the organic light-emitting diode.

Our organic light-emitting diodes described here are explained in more detail below with reference to the drawings on the basis of examples. Identical reference signs indicate the same elements in the individual figures. In this case, however, no relationships to scale are illustrated, but rather individual elements can be represented with an exaggerated size to afford a better understanding.

An example of an organic light-emitting diode 1 is shown in a plan view in FIG. 1A and in a sectional view and in FIG. 1B. The light-emitting diode 1 comprises a carrier 2 which is, for example, a glass plate or a glass film. A first electrode 3a, 3b, 33 is located on the carrier 2, and the first electrode 3a, 3b, 33 comprises a layer 3a made of a transparent conductive oxide, for example, ITO. The layer 3a has, for example, a thickness of approximately 100 nm. A metallic electrical contact strip 3b is located on the layer 3a, wherein the contact strip 3b can connect to an external electrical contact (not shown). Furthermore, metallic central contact strips 33 that can form a hexagonal pattern when viewed in a plan view are optionally located on the layer 3a.

An organic layer sequence 4 having at least one active zone is applied to the first electrode 3a, 3b, 33. The metallic structures 3b, 33 are separated from the organic layer sequence 4 by electrical insulations 75 so that current is impressed by the first electrode 3a, 3b, 33 only through the layer 3a.

A second electrode 5a, 5b, 5c is located on a side of the organic layer sequence 4 facing away from the carrier 2. A current impression into the organic layer sequence 4 takes place via the layer 5a, which is preferably formed from a reflecting metal such as Ag or Al. An external electrical contacting of the layer 5a preferably takes place via the metallization 5b, which is applied to a strip 35, 5c. The strip 35, 5c is preferably likewise formed from a transparent conductive oxide in the same way as the layer 3a of the first electrode 3a, 3b, 33. The electrical insulation 75 is located between the layer 3a and the strip 35, 5c in the direction parallel to a main surface of the carrier 2. On a side of the second electrode 5a, 5b, 5c facing away from the carrier 2, there is preferably an encapsulation layer (not shown) designed to be electrically insulating, in particular a so-called thin-film encapsulation (TFE).

For uniform current impression into the organic layer sequence 4, the second electrode 5a, 5b, 5c is provided with a structuring 9 in an edge region. In this case, in a plan view the structuring 9 is preferably located completely adjacent to the organic layer sequence 4. By such a structuring 9, the external appearance of the organic light-emitting diode is impaired, cf. also FIG. 2B. To conceal the structuring 9, visual protection layers 6a, 6b are present. The visual protection layers 6a, 6b are made of a light-impermeable material such as metal.

At least the visual protection layer 6a, which is located directly on the carrier 2, can be configured as a mirror for radiation striking the organic light-emitting diode 1 from the outside. Seen from a side of the carrier 2, the structuring 9 is completely hidden by the visual protection layer 6a. Optionally, the visual protection layer 6b is also present on a side of the second electrode 5a, 5b, 5c facing away from the carrier 2. The electrically insulating encapsulation layer (not shown) is preferably located between the upper visual protection layer 6b and the second electrode 5a, 5b, 5c. To electrically insulate the lower protection layer 6a from the electrodes 3a, 3b, 33, 5a, 5b, 5c, an insulation layer 7 is preferably present, for example, made of a radiation-transmissive material such as a silicon oxide.

In the direction parallel to a main side of the carrier 2, the lower protection layer 6a terminates flush with the electrical insulation 75 at the contact strip 6b. Thus, in top view onto the carrier, no region of the organic layer sequence 4 in which current is impressed and in which radiation is generated is hidden by the visual protection layer 6a. Thus, the visual protection layer 6a has no or no significant influence on an emission characteristic of the organic layer sequence 4 and of the organic light-emitting diode 1. The same applies to the visual protection layer 6b, which is arranged on a side of the light-impermeable layer 5a of the second electrode 5a, 5b, 5c facing away from the organic layer sequence 4.

According to FIGS. 1A & 1B, the visual protection layer 6a has only a relatively small thickness, for example, at least 10 nm and/or at most 30 nm or 50 nm. In contrast it is possible that the visual protection layer 6a has a greater thickness than the layer 3a of the first electrode 3a, 3b, 33. In a side of the layer 3a facing away from the carrier 2, unlike in FIG. 1A, a step can be formed at the point at which the visual protection layer 6a begins. The insulation layer 7 preferably has only a small thickness, for example, at least 5 nm or 10 nm and/or at most 60 nm or 40 nm.

If the layer 5a of the second electrode 5a, 5b, 5c is a radiation-transmissive layer, the further visual protection layer 6b is particularly preferably also present to completely conceal the structuring 9.

Optionally, in a plan view of the carrier 2 and between the central contact strips 33 and the carrier 2, an additional visual protection layer 6c is provided. In contrast to the illustration, the insulation layer 7 can also be arranged between the additional visual protection layer 6c and the layer 3a of the first electrode 3a, 3b, 33. Seen in a plan view, the additional visual protection layer 6c can also terminate flush with the central contact strips 33 and/or the associated electrical insulation 75. Such an additional visual protection layer 6c can also be present in all other examples.

As in all other examples, reflectivity of the visual protection layers 6a, 6b, 6c for visible light is preferably at least 80% or 90% or 95%. This is achieved, for example, in that the visual protection layers 6a, 6b, 6c have a reflective material such as silver or aluminum as a main constituent. Furthermore, the visual protection layers 6a, 6b, 6c can be provided with further, in particular metallic, materials, that can also occur in particular in the components 5a, 5b of the second electrode. The metallization 5b is formed, for example, as a layer sequence composed of molybdenum, aluminum and molybdenum or chromium, aluminum and chromium; the layer 5a is made of aluminum or silver, for example.

Alternatively, it is possible for the visual protection layers 6a and/or 6c, in particular, to have a transparent matrix material such as a silicone or an epoxide, into which light-scattering particles, for instance made of titanium dioxide, are embedded. By the light-scattering particles, the visual protection layers 6a, 6c appear opaque to a viewer and milky-turbid. In this case, it is possible for the individual visual protection layers 6a, 6b, 6c to be composed of different materials so that, for example, the visual protection layer 6a appears milky-opaque and the visual protection layer 6b is composed of reflective metals.

Figure 2:
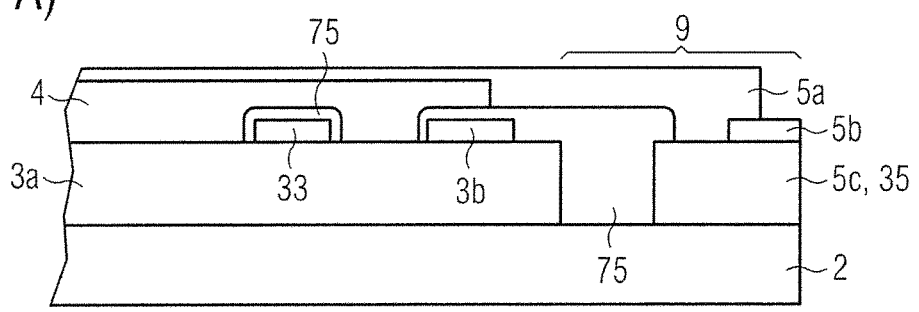
FIGS. 2A-2B show schematic representations of a modification of an organic light-emitting diode.
Figure 2:
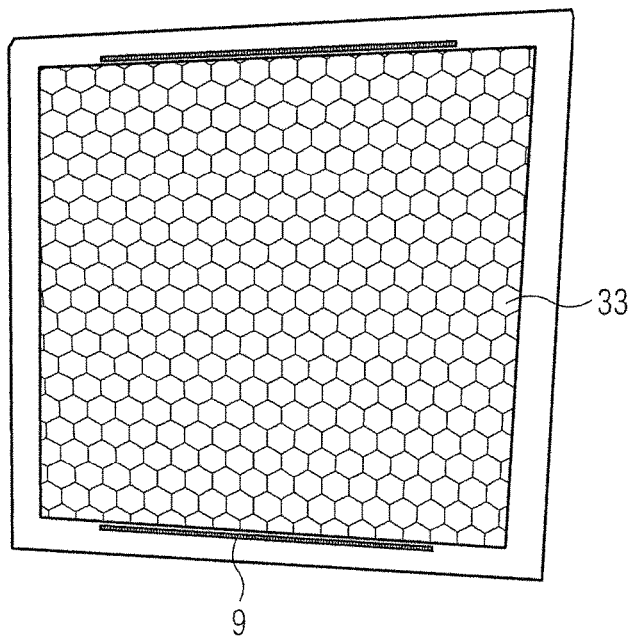

In a modification of an organic light-emitting diode, as seen in the sectional view in FIG. 2A and the top view in FIG. 2B, the structuring 9 can occur in a disturbing manner.

Figure 3:
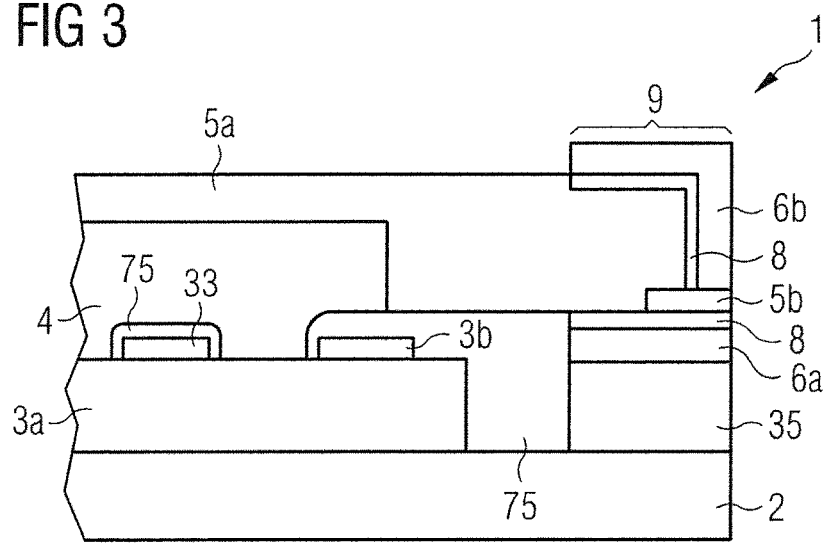

In the examples in the sectional representation of FIG. 3, the visual protection layer 6a and the optional visual protection layer 6b are restricted to a region with the structuring 9 and thus to the TCO strip 35. Thus, the protection layers 6a, 6b as well as the strip 35 and the structuring 9, viewed in particular in a plan view, are spaced apart from the organic layer sequence 4.

Between the visual protection layers 6a, 6b and the layer 5a and the metallization 5b of the second electrode, there can each be an adhesive layer 8. In this way, a fixed, form-fit adhesion of the visual protection layers 6a, 6b to the second electrode 5a, 5b can be ensured so that the second electrode 5a, 5b with the structuring 9 cannot be removed from the visual protection layers 6a, 6b without being destroyed.

It is possible for the adhesive layer 8 to be composed of a material comprising a material of the electrical insulation 75 or also that the electrical insulation 75 and the adhesive layer 8 are composed of the same material.

In contrast to the examples, it is possible for each of visual protection layers 6a, 6b, 6c to have a roughening on a side facing the carrier 2 and/or facing away from the carrier 2, in particular to conceal the structuring 9 more effectively.

In contrast to the drawings, it is possible for the visual protection layers 6a, 6b, 6c, in particular for the visual protection layers 6a and/or 6b, to have an identification code or a mark name to enable an unambiguous identification of the organic light-emitting diode 1.

The insulation layer 7 and/or the adhesive layer 8 are preferably composed of a material mixture. The use of such a material mixture makes it difficult to deduce a composition of further components of the organic light-emitting diode 1.

Our organic light-emitting diodes are not restricted to the examples by the description on the basis of those examples. Rather, this disclosure encompasses any new feature and also any combination of features, including in particular any combination of features in the appended claims, even if the features or combination itself are not explicitly specified in the claims or examples.

This application claims priority of DE 10 2016 101 517.2, the subject matter of which is incorporated herein by reference.

The invention claimed is:

1. An organic light-emitting diode comprising:
a carrier;
at least two electrodes;
an organic layer sequence having at least one active zone that generates light; and
light-opaque visual protection layers that have no influence on an emission characteristic of the organic layer sequence and the organic light-emitting diode,
wherein one of the light-opaque visual protection layers is located directly on the carrier,
the organic layer sequence is located between the at least two electrodes and one of the at least two electrodes is attached directly to the carrier,
at least one of the light-opaque visual protection layers, viewed in a plan view, completely surrounds the organic layer sequence,
at least one of the at least two electrodes is provided with a structuring in a region adjacent to the light-opaque organic layer sequence in a plan view,
in a plan view, the structuring is located completely beside the organic layer sequence, and
the structuring is hidden by the at least one of the light-opaque visual protection layers for a viewer from outside the organic light-emitting diode.

2. The organic light-emitting diode according to claim 1, wherein the visual protection layers are electrically conductive and electrically isolated from the at least two electrodes and the organic layer sequence by an insulation layer.

3. The organic light-emitting diode according to claim 1, wherein the at least two electrodes comprise a first electrode and a second electrode,
at least one of the light-opaque visual protection layers extend in places between the first electrode and the carrier,
the first electrode is closer to the carrier than the second electrode, and
the at least one of the light-opaque visual protection layers is only partially covered by the first electrode.

4. The organic light-emitting diode according to claim 1, wherein perpendicular to a main emission direction of the organic layer sequence, at least one of the light-opaque visual protection layers at least partially terminates flush with a region of the organic layer sequence, and
the region is supplied with current by the at least two electrodes, and
the organic layer sequence has a negligible electrical transverse conductivity.

5. The organic light-emitting diode according to claim 1, wherein, in a lateral direction, at least one of the light-opaque visual protection layers terminates at least in regions flush with a strip made of a transparent conductive oxide,
the strip completely surrounds the organic layer sequence and is completely arranged beside the organic layer sequence, seen in plan view, and
the strip is applied directly to the carrier and the carrier is light-transmissive.

6. The organic light-emitting diode according to claim 1, wherein at least one of the light-opaque visual protection layers fixedly connects to at least one of the at least two electrodes via an adhesive layer, and
the adhesive layer adheres more strongly to an associated electrode from the at least two electrodes than the associated electrode does to a material on a side opposite the adhesive layer so that the associated electrode is irreversibly fastened to the adhesive layer.

7. The organic light-emitting diode according to claim 1, wherein the at least one of the light-opaque visual protection layers comprise or consist of an organic matrix material and at least one foreign substance dissolved and/or embedded therein, and
the organic matrix material is translucent and the at least one foreign substance is opaque and selected from the group consisting of scattering particles, phosphor, dye and heat-conducting body.

8. The organic light-emitting diode according to claim 1, wherein at least one of the light-opaque visual protection layers comprises or consists of at least two metals,
at least one of the at least two metals also occurs in the at least two electrodes and at least one other of the metals does not occur in the at least two electrodes, and
at least one metal present in the at least one of the light-opaque visual protection layers and in at least one of the at least two electrodes is selected from the group consisting of Ag, Al, Cr and Mg.

9. The organic light-emitting diode according to claim 1, wherein each one of the at least one of the light-opaque visual protection layers contains a weight proportion of at least 1% and at most 20% of one selected from the group consisting of Au, Bi, Cr, Cu, Mo, Sn, Pt and mixtures thereof.

10. The organic light-emitting diode according to claim 1, wherein the at least two electrodes comprise a first electrode and a second electrode,
the first electrode, located closer to the carrier than the second electrode, comprises metallic central contact strips, and
the at least one of the light-opaque visual protection layers is additionally located between the carrier and the central contact strips.

11. The organic light-emitting diode according to claim 1, wherein the at least two electrodes comprise a first electrode and a second electrode, and
at least the second electrode, located on a side of the organic layer sequence facing away from the carrier, is structured into a plurality of individually controllable sections.

12. The organic light-emitting diode according to claim 11,
wherein the second electrode has a plurality of partial regions composed of different materials, and
at least one of the partial regions is completely covered by at least one of the light-opaque visual protection layers.

13. The organic light-emitting diode according to claim 1, wherein at least one of the light-opaque visual protection layers covers at least one of the at least two electrodes on both sides.

14. The organic light-emitting diode according to claim 1, wherein at least one of the light-opaque visual protection layers is provided with a roughening for light scattering.

* * * * *